United States Patent
Cairone, Jr.

(10) Patent No.: US 12,048,115 B2
(45) Date of Patent: Jul. 23, 2024

(54) COOLING SYSTEM

(71) Applicant: DataKoolGreen, Inc., Medford, NJ (US)

(72) Inventor: Joseph A. Cairone, Jr., Medford, NJ (US)

(73) Assignee: DATAKOOLGREEN, INC., Medford, NJ (US)

( * ) Notice: Subject to any disclaimer, the term of this patent is extended or adjusted under 35 U.S.C. 154(b) by 0 days.

(21) Appl. No.: 18/070,162

(22) Filed: Nov. 28, 2022

(65) Prior Publication Data

US 2023/0171920 A1 Jun. 1, 2023

Related U.S. Application Data

(60) Provisional application No. 63/283,707, filed on Nov. 29, 2021.

(51) Int. Cl.
*H05K 7/20* (2006.01)

(52) U.S. Cl.
CPC ..... *H05K 7/20254* (2013.01); *H05K 7/20781* (2013.01)

(58) Field of Classification Search
CPC ............ H05K 7/20254; H05K 7/20781; Y02E 10/10; Y02E 60/14; Y02E 70/30
See application file for complete search history.

(56) References Cited

U.S. PATENT DOCUMENTS

| | | | |
|---|---|---|---|
| 11,480,160 B1* | 10/2022 | Mokheimer | F03G 4/001 |
| 2014/0368991 A1 | 12/2014 | James | |
| 2015/0021924 A1* | 1/2015 | Parella, Sr. | H02K 7/1807 165/45 |
| 2015/0033779 A1* | 2/2015 | Seggerman | F25B 41/22 62/426 |
| 2017/0293330 A1* | 10/2017 | Hardin | F03G 7/04 |
| 2019/0101311 A1* | 4/2019 | Rutherford | F24F 13/30 |
| 2021/0156601 A1* | 5/2021 | Melink | F25B 13/00 |
| 2021/0293421 A1* | 9/2021 | Niemi | F24F 1/60 |
| 2022/0322580 A1* | 10/2022 | Thornock | H05K 7/2079 |

OTHER PUBLICATIONS

International Search Report issued in International Application No. PCT/US2022/051099, completed on Feb. 27, 2023, to be mailed by Jul. 3, 2023.

* cited by examiner

*Primary Examiner* — Adam B Dravininkas
(74) *Attorney, Agent, or Firm* — Volpe Koenig

(57) ABSTRACT

A cooling system for cooling electronic equipment is disclosed herein. The cooling system includes geothermal wells including internal pumps. A cold plate thermal exchanger is in fluid communication with the geothermal wells. A fluid circuit is configured to direct cooling fluid from the geothermal wells to enclosures housing the electronic equipment. The system disclosed herein is environmentally responsible and utilizes renewable sources of energy. The system disclosed herein takes advantage of subterranean thermal recharging of cooling fluid, and is also configured to direct cooled fluid back into geothermal wells under certain conditions.

20 Claims, 4 Drawing Sheets

COOLING SYSTEM

RELATED APPLICATIONS

The present application claims the benefit of and priority to U.S. Provisional Patent Application No. 63/283,707, entitled "Cooling System," filed Nov. 29, 2021, the entirety of which is incorporated by reference herein.

FIELD OF INVENTION

The present disclosure relates to a cooling system and is more particularly directed to a cooling system using vertical geothermal wells or horizontal geothermal ground piping loops.

BACKGROUND

Cooling systems and assemblies are generally used to ensure that electronic equipment, such as computers, servers, or other devices, are maintained at an operating temperature that does not jeopardize the functioning of the associated hardware.

One known type of installation or building that requires large quantities of computing power and equipment is a data center or computer processing center. Due to latency with transmission of data across geographical distances, there is a growing demand to be able to construct data centers in a variety of physical locations. This demand is increasing particularly as certain technologies, such as autonomous cars, new wireless standards (i.e. 5G), and associated technologies, drive the need for greater data processing capacity.

In the financial sector, there is an ever increasing need to provide data centers in close proximity to financial hubs, such as stock exchanges or commodity trading centers, to ensure that commands, orders, or trades are quickly executed.

Other applications, such as cryptocurrency mining, or other types of data or electronic mining activity require vast computing power to carry out the associated mining activity. It would be desirable to provide a solution that greatly reduces the energy impact of these activities.

Attempts for providing a cooling system for large data centers include installing cold-water chillers, cooling towers, computer room air conditioners (CRAC), large diesel generators, or other bulky, expensive, or energy inefficient arrangements. Such implementations have detrimental impacts on the environment.

SUMMARY

The present disclosure is directed to implementations of systems and methods for providing cooling systems for data centers or processing centers that is environmentally sustainable, requires minimal external power source, and is also scalable. By using one or more geothermal wells for heat transfer, implementations of these systems are sustainable, practical, and efficient. In many implementations, a plurality of geothermal wells may be configured to provide cooling for a plurality of computing enclosures or systems, with load balancing or heat redirection such that each well is never thermally overwhelmed by the computing equipment in a corresponding enclosure or system. For example, in many implementations, one geothermal well may be utilized for each 42-standard unit (e.g. 42U) electronic equipment rack enclosure in a system, and may provide sufficient thermal cooling for installed computer servers, network hardware, or other electronic devices in the enclosure. Multiple wells and enclosures may be interconnected in a manifold array, such that any excess cooling capacity not utilized or needed by any enclosure may be returned to the geothermal well array for thermal load balancing and/or recharging of the geothermal wells. Accordingly, excess cooling capacity may be stored and utilized as needed, even over multiple seasons with corresponding temperature variations.

In many implementations, the equipment enclosures or racks may be configured to allow geothermal cooling fluid to flow directly to the cabinet (e.g. without a separate heat transfer fluid), increasing efficiency and reducing system complexity. In many implementations, each enclosure may only circulate cool air inside of the enclosure, and may be sealed such that the outside of the enclosure (e.g. the rest of the data center) is not cooled, increasing overall system efficiency. In various implementations, electric power consumption relative to forced air-based cooling may be reduced by 4-5 times, for example reducing power consumption needed for cooling from 50% of the electric power utilized by the data center to 10% or less.

A cooling system for cooling electronic equipment is disclosed herein. The cooling system includes at least one geothermal well including an internal pump. At least one cold plate thermal exchanger is in fluid communication with the at least one geothermal well. At least one enclosure is provided that is configured to house the electronic equipment. A fluid circuit is configured to direct cooling fluid to the at least one enclosure from the at least one geothermal well.

In one aspect, the system further comprises at least one cold plate thermal exchanger configured to cool fluid within the fluid circuit. In one aspect, this configuration is adapted based on geographical or seasonal outdoor temperature availability and optimization.

A canopy can be provided that is configured to surround a portion of the at least one cold plate thermal exchanger. The at least one cold plate thermal exchanger can be formed as a stainless-steel structure. An exterior of the cold plate thermal exchanger is powder coated with a white finish to reflect solar heat or thermal gain.

The canopy can include a plurality of solar cells configured to generate power. At least one energy storage with a UPS unit is configured to store energy generated by the plurality of solar cells, thereby replacing lead-acid batteries and independently harvesting solar generated power.

At least one temperature-controlled mixing valve is provided that is configured to direct fluid through the at least one cold plate thermal exchanger. The at least one temperature-controlled mixing valve can be configured to direct fluid towards the at least one geothermal well when an ambient temperature is less than 45° F. or 7° C.

A plurality of check valves can be provided within the fluid circuit.

In one aspect, at least one warm fluid return pump is connected to an exhaust portion of the fluid circuit exiting the at least one enclosure.

A circulator pump can be connected to the fluid circuit adjacent to the at least one geothermal well and can be configured to direct fluid towards the at least one enclosure The at least one geothermal well can be productive at a depth of at least 300 feet (91.4 meters). In one aspect, a geothermal ground loop can be productive at a depth of 5 feet (1.5 meters) and 500 lineal feet (152.4 meters) of looped pipe per 0 (12,000 BTU).

The system can further include a backup power generator, which in the event of a local power outage, can be used to primarily power the geo-well pumps and provide computer rack level power to the electronic and computer equipment. In one aspect, the system emergency generator relies on natural gas or propane.

In one aspect, the cooling system does not include any actively powered cooling sources or refrigerant.

The fluid circuit is a closed fluid circuit, in one aspect. Fluid within the fluid circuit can consist of a solution including water and an anti-freeze liquid.

The at least one enclosure can include a plurality of enclosures, the at least one geothermal well can include a plurality of geothermal wells, and a quantity of the enclosures is equal to a quantity of the geothermal wells or thermal design ratios for lesser cooling needs.

The at least one enclosure can be formed as a rack configured to house a plurality of electronic servers or computing equipment.

A method for cooling electronic equipment is provided, in one aspect. The method includes pumping geothermally cooled fluid through a fluid circuit from a plurality of geothermal wells. The method includes further cooling fluid within the fluid circuit via at least one cold plate thermal exchanger that is exposed to an ambient environment that is geographically or seasonally efficient. The fluid within the fluid circuit is selectively exposed to the at least one cold plate thermal exchanger based on a signal from at least one temperature-controlled mixing valve. The method includes providing the cooled fluid to a plurality of enclosures housing the electronic equipment.

Additional embodiments are disclosed herein.

BRIEF DESCRIPTION OF THE DRAWINGS

The foregoing Summary and the following Detailed Description will be better understood when read in conjunction with the appended drawings, which illustrate a preferred embodiment of the disclosure. In the drawings.

DETAILED DESCRIPTION OF THE PREFERRED EMBODIMENTS

Certain terminology is used in the following description for convenience only and is not limiting. A reference to a list of items that are cited as "at least one of a, b, or c" (where a, b, and c represent the items being listed) means any single one of the items a, b, or c, or combinations thereof. The terminology includes the words specifically noted above, derivatives thereof and words of similar import.

Figure 1:
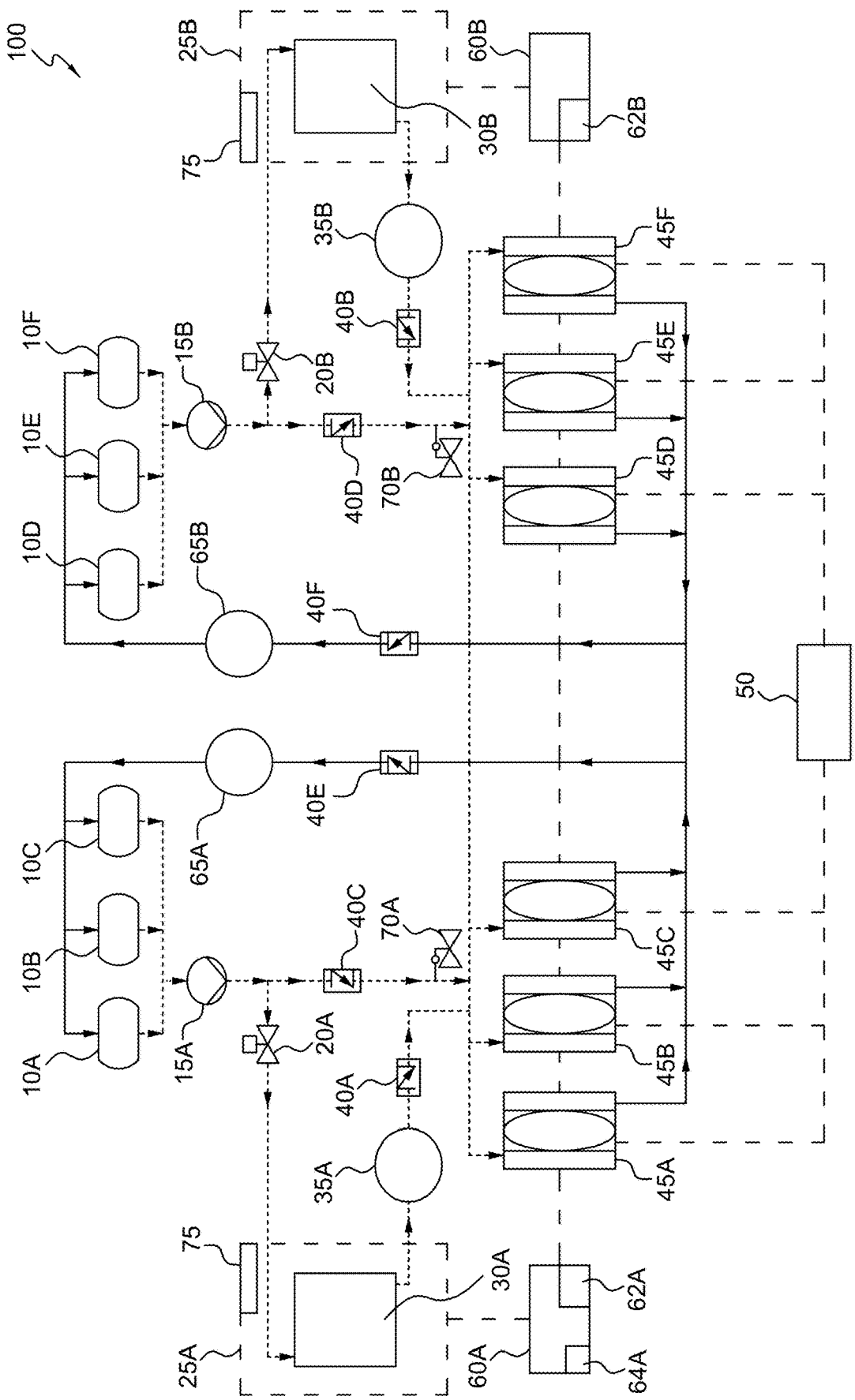
FIG. 1 is a schematic diagram of a cooling system, according to some implementations.

As shown in FIG. 1, in one aspect, the cooling system 100 disclosed herein includes a plurality of geothermal closed loop, deep wells, such as elements 10A-10F, are generally arranged in a manifold array or junction array. In one aspect, the geothermal wells 10A-10F are configured to supply naturally cool or chilled water through the natural thermal or heat transfer provided by a subterranean portion of the ground surface. The geothermal wells 10A-10F can each include internal pumps (not illustrated) that are generally configured to circulate water and antifreeze liquid from the closed loop, vertical column ground source. Additional pumping may be provided via one or more pumps 65A, 65B, which may be referred to variously as warm water return pumps, primary pumps, well group pumps, or by any other similar terms. In some implementations, such as where internal pumps within each geothermal well provide sufficient pumping force, pumps 65A, 65B may be omitted.

As shown in FIG. 1, cool fluid lines are indicated with short, dashed lines, warmed fluid lines or exhaust lines are indicated with solid lines, and electrical connections are generally indicated with long dashed lines. The connections between any one or more of the components can vary and FIG. 1 is a schematic of the general configuration. Accordingly, additional lines for either fluid or electrical connections can be provided that are not specifically illustrated.

At least one pump 15A, 15B is provided that is configured to generally pump cool or chilled water to an enclosure 45A-45F. The at least one pump 15A, 15B can be a booster circulator pump that provides auxiliary pumping action to drive the cooled water away from the geothermal wells 10A-10F, and may be variously referred to as a booster pump, a return pump, a cold pump, or by similar terms. For example, in some implementations, a booster circulator pump (15A, 15B) may be utilized as a backup or redundant pump when a pump 65A, 65B and/or well 10A-10F requires maintenance or repair and may be disabled, offline, or otherwise removed from service. In some implementations, a booster circulator pump (15A, 15B) may be utilized dynamically to provide additional cool water delivery if corresponding equipment or enclosures (e.g. 45A-45C, 45D-45F) require elevated cooling for a particular duration (e.g. responsive to monitoring enclosure or equipment temperatures, enclosure or equipment power consumption, enclosure or equipment processor or network utilization, etc.). Monitoring hardware, such as temperature sensors, may communicate with booster pumps or booster pump controllers (not illustrated) to activate the pumps as needed. In some implementations, booster pump controllers may communicate with and/or receive status reports from computing equipment (e.g. via a simple network management protocol (SNMP), via remote procedure calls (RPCs), via operating system application programming interfaces (APIs), via representational state transfer (RESTful) requests to web servers provided by equipment, via serial communications protocols (e.g. RS-232 or RS-485), or via any other suitable communications system). The at least one pump 15A, 15B can be optional, and the system 100 could instead rely on the pumps integrated within the geothermal wells 10A-10F to circulate the cooled fluid.

Enclosures 45A-45F, referred to generally as an enclosure 45, may comprise rackmount equipment cabinets, open frame equipment racks, closed frame equipment racks, or any other type and form of enclosure or structure for electronic components, including rackmount computers, network hardware, switches, storage devices, monitoring devices, or any other such equipment. In one aspect, the enclosure 45A-45F can be an enclosed electronic component cabinet structure. The cabinet structure can include heat exchangers that are configured to receive the cool or chilled water. The heat exchangers in the cabinet can include a plurality of pipes, tubing, fins, or any other known type of heat exchanger structure. Although this application discloses using geothermal cooled fluids to maintain electronics at a lower temperature, the cooling arrangement could be used for any application, including those not specifically directed to cooling electronic components.

In one aspect, air movers, such as fans, blow air across the heat exchangers in the enclosures to circulate cooled air. As the fluid circulates through the enclosure, the fluid will generally warm up due to heat generated by the electronic components. The fluid circuit is configured to return warmed fluid back to the geothermal wells 10A-10F, and the warmed fluid is then once again naturally cooled. In one aspect, the fluid circuit used by the system is a fully self-sustaining or self-sufficient system in which the fluid is continuously cycled in a repetitive circulative cooling arrangement.

The geothermal wells 10A-10F can include a supply conduit or pipe, and a return conduit or pipe. Additional piping or conduits can be provided. A closed fluid circuit loop is generally configured to pass fluid through a well pump (i.e. internal or integrated pump) arranged within geothermal wells 10A-10F. In one aspect, the supply and return pipes are arranged generally vertically relative to the ground surface. The exact configuration of the pipes and conduits can vary. Deep well drilled boreholes, which can be approximately five or six inches (12.7 to 15.2 centimeters) in diameter, can be filled and stabilized with a slurry grout material to maximize thermal conductivity and protect the supply and return piping. The closed fluid circuit of pipes or conduits to the pump can consist of water and an anti-freeze type liquid, in one aspect. The anti-freeze type liquid can include propylene glycol or similar fluids. This combination of fluids helps reduce possible corrosion in the heat exchangers as the fluid passes through the heat exchangers of the system and prevents freezing during the cold weather harvesting to thermally recharge the geo-wells. The system is specifically designed, in one aspect, to thermally lower the temperature of the geo-wells, and thereby recharge the geo-wells by directing cooled fluid to the pipes associated with the geo-wells.

In one aspect, the geothermal wells 10A-10F can be drilled to a depth of at least 300 feet (91.4 meters). The geothermal wells 10A-10F can be configured to provide or yield a minimum of two to three tons (24,000 to 36,000 BTU) of cooling capacity per geothermal well.

In one arrangement, each geothermal well 10A-10F is assigned to a particular enclosure 45A-45F. In other words, a quantity of geothermal wells 10A-10F can correspond to a quantity of the enclosures 45A-45F. In one example, the enclosures 45A-45F can be formed as an enclosed computer rack enclosure, such as a computer rack enclosure manufactured by Rittal (i.e. LCP Rack Cooling Unit 3311.238 or an equivalent), or Rittal enclosures 5510.220 and racking system.

Heat generated or created by electronics within one of the enclosures may be up to 15 kilowatts, in one aspect. The system disclosed herein is sufficient to counteract this heat such that the electronics are maintained at an optimal operating temperature. In one arrangement, a single one of the geothermal wells 10A-10F producing 2.5 tons (30,000 BTU) per hour of cooling capacity is sufficient to cool 8-9 kilowatts per hour.

The system disclosed herein provides a variable cooling system. By providing a plurality of geothermal wells 10A-10F, variable cooling on demand is provided via the use of at least one temperature sensing control valve 70A, 70B. In one aspect, the enclosures 45A-45F for the electronic equipment can include integrated temperature sensors that are configured to monitor the temperature of incoming and outgoing fluids. In one such arrangement, the temperature sensing control valve 70A, 70B can be omitted if the enclosures for the electronic equipment include temperature sensors. For example, in one aspect, there is a dual temperature sensing configuration in which a separate temperature sensing element (i.e. temperature sensing control valve 70A, 70B) is included in addition to an integrated temperature sensor, which can preferably be implemented within the enclosures for the electronic equipment. In this sense, a back-up or redundant temperature sensing arrangement is provided in the event. The temperature sensing control valves 70A, 70B generally increase the efficiency and energy conservation of the system by selectively providing cooling fluid to specific ones of the enclosures 45A-45F based on a detected temperature of the enclosures 45A-45F. Based on this configuration, the enclosures and the wells are configured for failover redundancy for cooling. This arrangement essentially ensures that there is not a one-to-one configuration between the enclosures and the geothermal wells. Instead, a manifold type arrangement can be provided in which any enclosure can be cooled via any geothermal well. This configuration is advantageous particularly if a specific geothermal well experiences any issues, then the remainder of the geothermal wells are used to maintain the cooling effect for the enclosures.

By including multiple geothermal wells 10A-10F, a cooling arrangement is provided that is redundant by using independently formed geothermal wells 10A-10F, thereby increasing the reliability of the cooling system. This arrangement is possible without requiring separate chillers or other refrigerant elements as used in data or electronic facilities not utilizing the systems and methods discussed herein.

Advantageously, many implementations of the systems and methods discussed herein do not require additional electric power other than that required for the circulating pumps to provide year-round cooling via geothermal wells. As data centers or other computing clusters may require significant power consumption, reducing power required for cooling may save manufacturing and ongoing costs. In particular, cold weather harvesting helps return a certain amount of cooling availability seasonally and geographically, providing a renewable aspect to implementations of such cooling systems.

As shown in FIG. 1, the system 100 further includes at least one cold plate thermal exchanger 30A, 30B. The cold plate thermal exchanger 30A, 30B can be arranged in an external or outside environment. The cold plate thermal exchanger 30A, 30B can generally be configured to take advantage of or harness a relatively cooler or cold ambient temperature to provide an additional cooling aspect for the system 100. The cold plate thermal exchanger 30A, 30B thereby harvests the cool or ambient air to help increase the overall cooling capacity of the system 100. For example, the cold plate thermal exchanger 30A, 30B is configured to be particularly advantageous when the ambient or outdoor temperature is 45° F. (7.2° C.) or lower.

In one aspect, the cold plate thermal exchanger 30A, 30B is configured to cool or chill fluid in the fluid circuit, which can then be circulated back to the geothermal wells 10A-10F or circulated directly to the enclosures 45A-45F.

At least one temperature-controlled mixing valve 20A, 20B can be provided that is generally configured to activate and direct fluid in the circuit towards the cold plate thermal exchanger 30A, 30B. A sensor can be provided within the temperature-controlled mixing valve 20A, 20B that is configured to detect when the air temperature reaches a predetermined threshold. After that threshold is reached, the temperature-controlled mixing valve 20A, 20B can open thereby directing fluid through the circuit towards the cold plate thermal exchanger 30A, 30B in order to further cool or chill the fluid. Once the temperature increases above the predetermined threshold, then the temperature-controlled mixing valve 20A, 20B can close such that the fluid within the circuit is not heated by the cold plate thermal exchanger 30A, 30B.

In one aspect, the cold plate thermal exchanger 30A, 30B can be formed as a stainless-steel structure that is corrosion resistant. An exterior of the cold plate thermal exchanger 30A, 30B can be coated, such as powder coated. The coating on the cold plate thermal exchanger 30A, 30B can have a white finish thereby rejecting or reflecting sunlight, which further increases the efficiency of the cold plate thermal exchanger 30A, 30B exterior cold temperature absorption.

Figure 2:
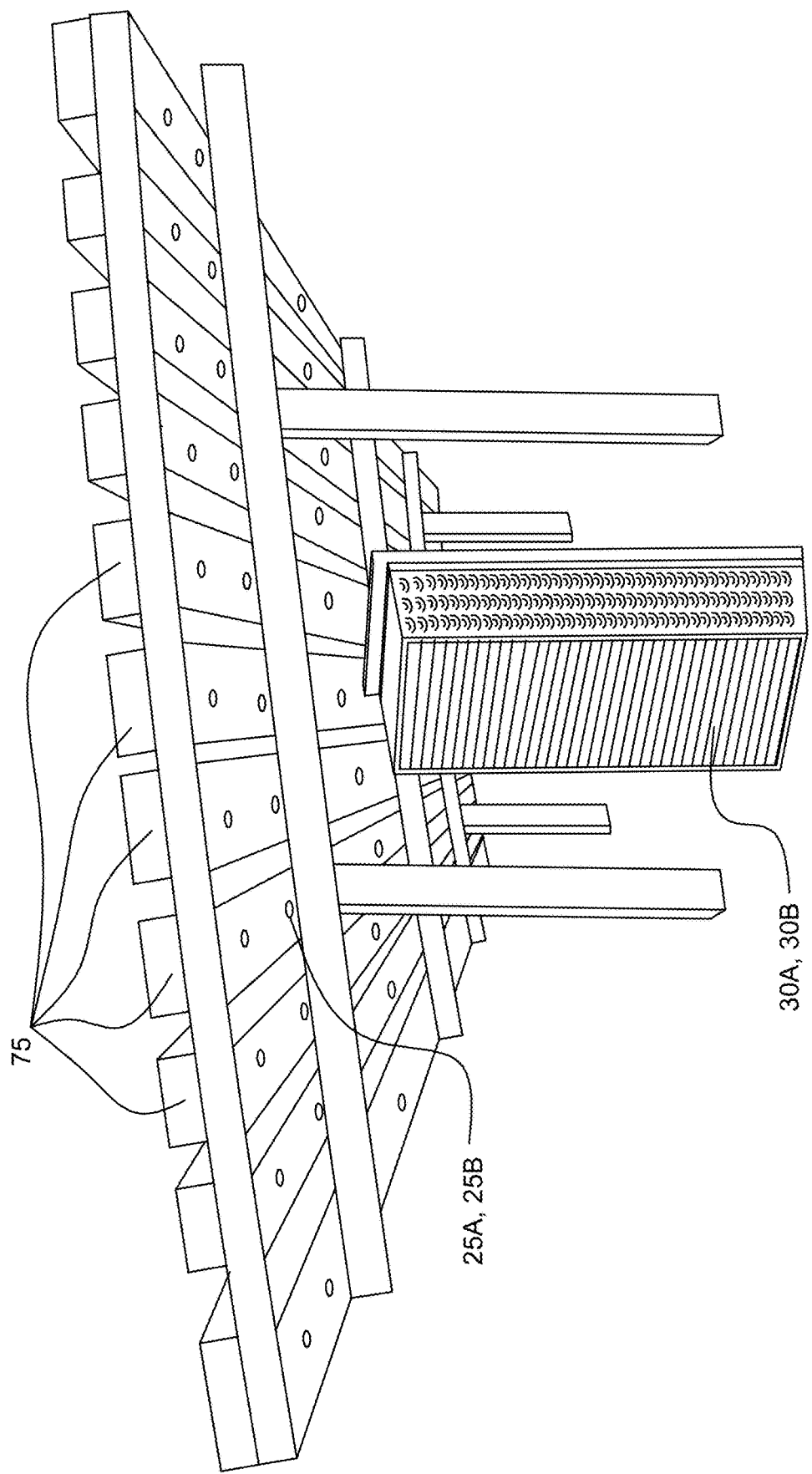
FIG. 2 is a side view of a particular aspect of the cooling system, according to some implementations.

The cold plate thermal exchanger 30A, 30B can be further shielded from sunlight or exposure via a canopy or shielding structure 25A, 25B, as shown in FIG. 2. The canopy 25A, 25B can be arranged directly above or vertical relative to the cold plate thermal exchanger 30A, 30B. The canopy 25A, 25B can have a sloped configuration or profile, in one aspect. The canopy 25A, 25B can be formed according to any type of structure, such as a series of columns supporting a generally planar upper surface.

In some implementations, one or more pumps 35A, 35B, which may be referred to variously as cold plate circulator pumps, cold water pumps, cooling pumps, or by similar terms, may be connected to a corresponding one or more cold plate thermal exchanger 30A, 30B as shown, to aid in water flow through and from the thermal exchanger to computer enclosures 45A-45F. In some implementations, to prevent backflow, one or more check valves 40A, 40B may be installed between cold plate thermal exchangers 30A, 30B and computer enclosures 45A-45F (or between cold plate circulator pumps 35A, 35B and enclosures 45A-45F as shown). Similarly, in various implementations, check valves 40C, 40D may be installed between booster pumps 15A, 15B; and check valves 40E, 40F may be installed between pumps 65A, 65B and enclosures 40A-4F as shown. In various implementations, one or more of pumps 35A, 35B and/or check valves 40A-40F may be optional and may be omitted.

A plurality of solar panels or cells 75 can be provided on a surface of the canopy 25A, 25B, as shown in FIG. 2. The solar panels 75 are configured to generate electrical power based on the sun's energy and orientation. Energy or power from the solar panels 75 can then be used to power any other component of the system 100 or external elements. In one arrangement, the solar panels 75 can provide DC or power to the electronic components, i.e. servers and computers, within the enclosures 45A-45F. This type of arrangement can bypass conversion from AC to DC, which is typically wasteful and has a low efficiency.

Figure 3A:
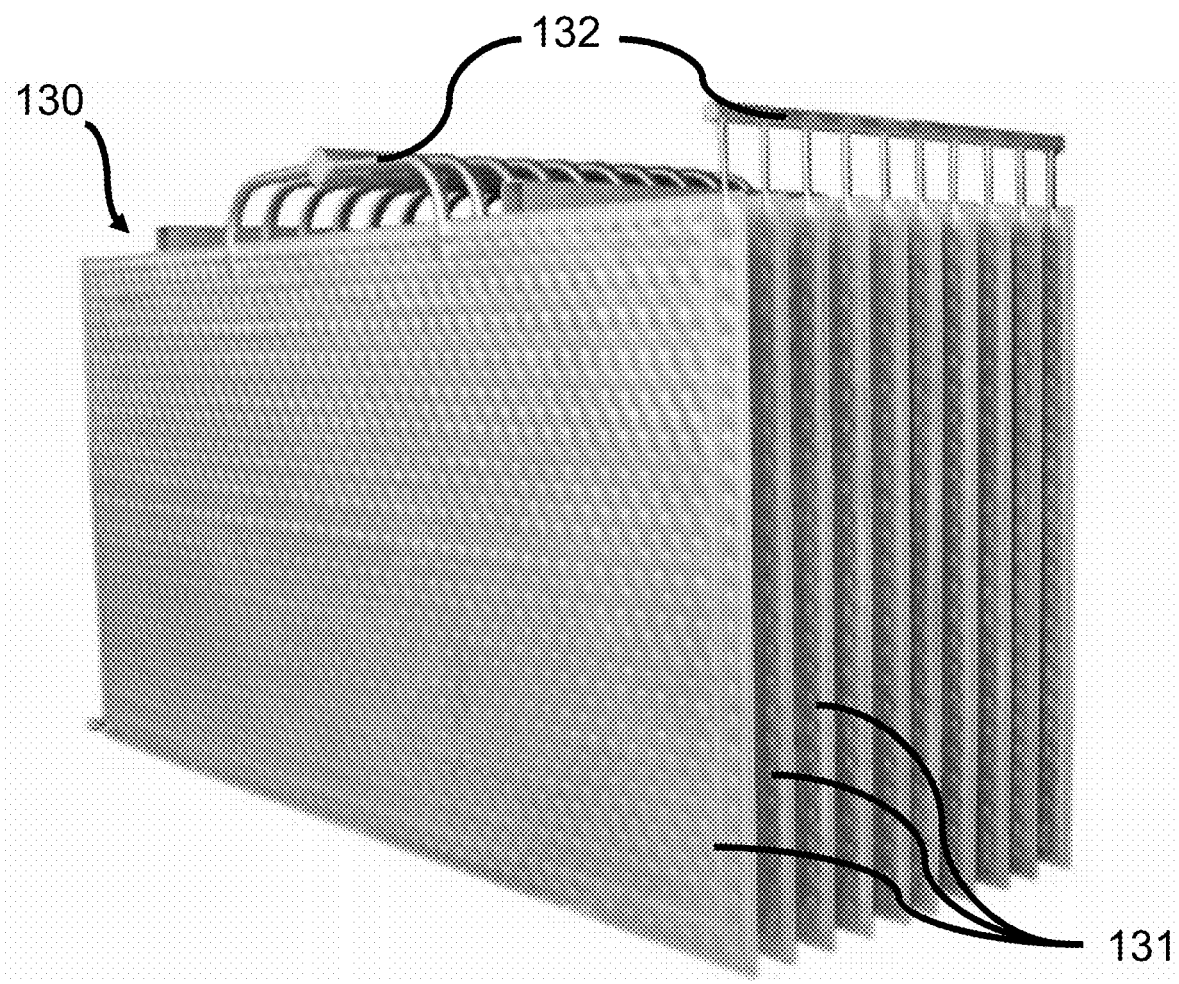
FIGS. 3A and 3B illustrate embodiments for a cold plate thermal exchanger, according to some implementations.

FIG. 3A illustrates an embodiment for a cold plate thermal exchanger 130, which is embodied as a pillow plate design including inflow and outflow pipes 132. The pipes 132 can be connected to the fluid circuit and can be configured to circulate fluid within plates 131. The cold plate thermal exchanger 130 can include a plurality of plates 131, which can be considered pillow plates. The plates 131 can be coated with an ultra-white paint coating. In one aspect, the coating can include barium sulfate particles applied in a powder coated process or method. This configuration provides superior sun and light reflectivity, thereby making cold weather harvesting more efficient. The cold plate thermal exchanger 130 would otherwise be used in an identical manner as the cold plate thermal exchanger 30A, 30B, and similarly can be arranged under a canopy.

Figure 3B:
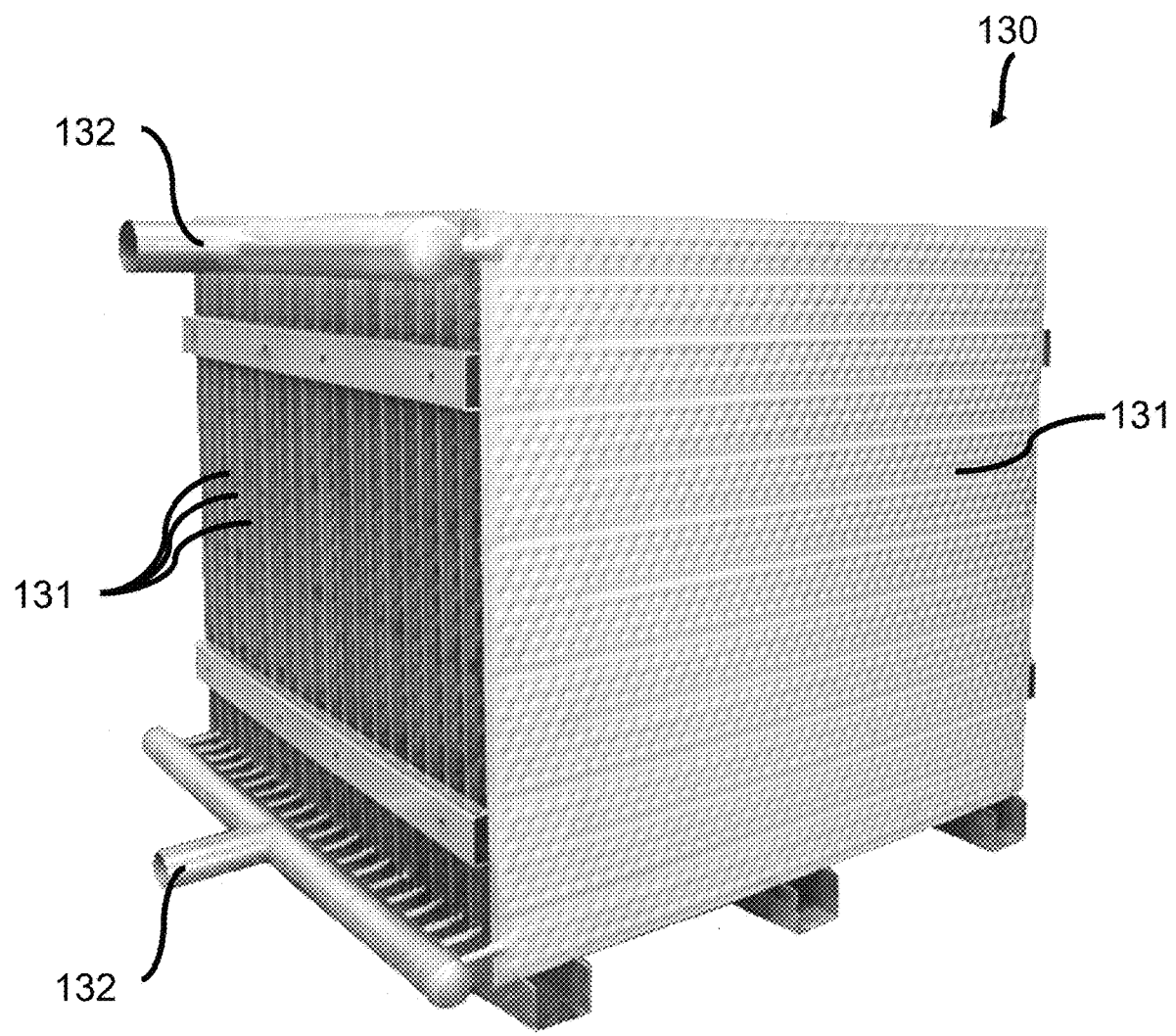

FIG. 3B is an illustration of another embodiment for a cold plate thermal exchanger 130, also embodied as a pillow plate design including inflow and outflow pipes 132. As shown, different arrangements of plates 131 and inflow and outflow pipes 132 are possible in different implementations.

Cold plate thermal exchangers 130 may accordingly comprise a plurality of cooling plates or pillow plates. Each plate 131 may have a structure configured to maximize internal water turbulence to increase efficiency of thermal transfer between the fluid and plates, and may maximize the contact duration of the cooling fluid in the system. For example, in some implementations as shown, each plate 131 may have a pattern of indents, bumps, or ridges, increasing contact surface area and impeding smooth flow of fluid from inflow to outflow pipes 132.

In another embodiment, a plurality of cooling plates or cold weather harvesting plates can be immersed in a fluid or liquid medium, such as water. The cold temperature absorption for said arrangement is augmented via the liquid as compared to cold air, thereby increasing the thermal energy transfer between the liquid and the plates. The plates in the immersed liquid can include a coating similar to the plates 131.

At least one energy storage unit 60A, 60B is provided that is generally electrically connected to the solar panels 75. The at least one energy storage unit 60A, 60B can include a battery storage array 62A, 62B and an uninterruptable power supply (UPS) 64A, 64B for back-up power stored within the at least one energy storage unit 60A, 60B. The UPS 64A, 64B can include energy storing units, which can include batteries, supercapacitors, or other electronic components. The at least one energy storage unit 60A, 60B can be configured to provide energy to the system 100 during any power interruptions, such as power outages.

In one aspect, the UPS 64A, 64B is configured to filter power or energy and delivery a modulated and constant supply of power during regular operating conditions, as well as during emergency situations or power outages.

As shown in FIG. 1, a power generator 50 can also be included. The power generator 50 can be a natural gas generator, or any other type of generator. The power generator 50 is generally configured as a back-up energy source, and serves as a redundancy feature to ensure that sufficient electrical power is also available. Having a constant, reliable source of power is critical for data centers, and therefore, the power generator 50 provides an additional power supplying feature to always ensure the data center is never without power. In one aspect, the system 100 is designed to eliminate the need for water chillers. The standby emergency powered generators can then simply power the geothermal pumps and computer racked equipment. The on-site electrical generation and electrical storage array can supplement any electrical power needs until the utility supplied primary power is restored.

The system 100 disclosed herein provides geothermal based cooling, in one aspect, and a solar panel array or solar panels 75, in another aspect, in order to ensure that DC power and cooling fluid is constantly provided to the enclosures 45A-45F. This configuration provides superior efficiency and minimizes electrical power loss due to the conversion from AC to DC power. As solar cells and storage batteries produce and store DC power, it is efficient and environmentally responsible to direct DC power to the computer equipment utilizing DC power. Reduction of external power sources and utilization and capture of renewable energy sources is one inherent aspect of this design. Conversion of power from AC to DC typically causes considerable loss of power and efficiency. Heat is also generated in the electricity conversion from AC to DC or DC to AC, which is specifically minimized by the system disclosed herein.

The power generator 50 is configured to deliver AC power to the geothermal wells 10A-10F (i.e. to power the pumps) and power for the UPS 64A, 64B, as well as the electronic components in the enclosures 45A-45F to supplement the power supplied by the solar panels 75 and the power supplied by the energy storage unit 60A, 60B.

In one aspect, the present system provides advantages over known cooling systems that require electrical systems using refrigerated water chillers. The present design provides a system that is scalable depending on the quantity of geothermal wells. The present system provides a solution that can be installed or built in a wide range of locations since the entire system is self-sustaining or self-contained. Therefore, the system can be built in locations that are closer to data sensitive environments or locations, which reduces latency and can provide improved profitability, increased production, and other advantages. The system design can also serve as a private cloud environment for companies, manufacturers or industries that are in need of or desirous of such private clouds which are cost effective and environmentally responsible.

A method for cooling electronic equipment is provided, in one aspect. The method includes pumping geothermally cooled fluid through a fluid circuit from a plurality of geothermal wells. The method includes further cooling fluid within the fluid circuit via at least one cold plate thermal exchanger that is exposed to an advantageous or seasonal ambient environment. The fluid within the fluid circuit is selectively exposed to the at least one cold plate thermal exchanger based on a signal from at least one temperature-controlled mixing valve. The method includes providing the cooled fluid to a plurality of enclosures housing the electronic equipment. The method can include multiple other steps.

Another important aspect of the design and invention or disclosure is that when the computer racked equipment in the enclosures is not in need of 100% of the cooling capacity of the system, then the excess cooling capacity (i.e. cooled fluid) is sent to the geo-well system and lowers the temperatures of the geo-well underground field array. Based on this aspect, this design has a global cooling feature, and is environmentally responsible.

Although primarily discussed in terms of traditional data centers, which may have hundreds or thousands of equipment enclosures, implementations of the systems and methods discussed herein may be utilized in other environments or contexts, including smaller locations. For example, "micro"-data centers comprising 5, 10, 20, or a similar number of equipment enclosures may be co-located at industrial sites, edge computing centers, cellular towers, etc., allowing for scalable distributed computing without requiring significant physical space. By replacing large air conditioning chillers with geothermal wells and significantly smaller pumps, implementations of these micro-data centers may require space measured in dozens of square feet or meters rather than thousands, and may be correspondingly less expensive to manufacture, install, and operate. Co-location at cellular sites or other network gateways (e.g. Internet infrastructure centers such as fiber or cable gateways, etc.) may also provide very low latency communications for critical systems, such as high frequency trading or other financial applications.

Reduced physical sizes and power consumption for data centers may also make on-premise computing more attractive for private enterprises, reducing reliance on cloud computing infrastructure. Co-location of such systems at cellular infrastructure may also increase reliability, as if physical interconnections between data sites are lost (e.g. due to storms or other emergencies), cellular or satellite communications can still be used. Many such sites also have on-site power generation, further increasing system resilience.

Having thus described the present disclosure in detail, it is to be appreciated and will be apparent to those skilled in the art that many physical changes, only a few of which are exemplified in the detailed description of the invention, could be made without altering the inventive concepts and principles embodied therein.

It is also to be appreciated that numerous embodiments incorporating only part of the preferred embodiment are possible which do not alter, with respect to those parts, the inventive concepts and principles embodied therein.

The present embodiment and optional configurations are therefore to be considered in all respects as exemplary and/or illustrative and not restrictive, the scope of the embodiments being indicated by the appended claims rather than by the foregoing description, and all alternate embodiments and changes to this embodiment which come within the meaning and range of equivalency of said claims are therefore to be embraced therein.

What is claimed is:

1. A cooling system for cooling electronic equipment, the cooling system comprising:
    a plurality of geothermal wells, each including an internal pump, each geothermal well of the plurality of geothermal wells connected in parallel with each other geothermal well of the plurality of geothermal wells;
    at least one cold plate thermal exchanger in fluid communication with the plurality of geothermal wells;
    at least one enclosure configured to house electronic equipment;
    a fluid circuit configured to direct cooling fluid to the at least one enclosure from the plurality of geothermal wells; and
    at least one temperature-controlled mixing valve that is configured to direct fluid from the plurality of geothermal wells to the at least one enclosure either via the at least one cold plate thermal exchanger responsive to an ambient temperature being equal to or less than a threshold, or not via the at least one cold plate thermal exchanger responsive to the ambient temperature being greater than the threshold.

2. The cooling system of claim 1, further comprising at least one cold plate thermal exchanger configured to cool fluid within the fluid circuit.

3. The cooling system of claim 1, further comprising a canopy configured to surround a portion of the at least one cold plate thermal exchanger.

4. The cooling system of claim 3, wherein the canopy includes a plurality of solar cells configured to generate power.

5. The cooling system of claim 4, further comprising at least one energy storage unit configured to store energy generated by the plurality of solar cells.

6. The cooling system of claim 1, further comprising a plurality of check valves provided within the fluid circuit.

7. The cooling system of claim 1, further comprising at least one warm fluid return pump connected to an exhaust portion of the fluid circuit exiting the at least one enclosure.

8. The cooling system of claim 1, further comprising a circulator pump connected to the fluid circuit adjacent to the plurality of geothermal wells and configured to direct fluid towards the at least one enclosure.

9. The cooling system of claim 1, wherein the plurality of geothermal wells has a depth of at least 300 feet (91.4 meters).

10. The cooling system of claim 1, further comprising a backup power generator.

11. The cooling system of claim 1, wherein the cooling system does not include any actively powered cooling sources or refrigerant.

12. The cooling system of claim 1, wherein the fluid circuit is a closed fluid circuit.

13. The cooling system of claim 1, wherein a fluid within the fluid circuit consists of a solution including water and an anti-freeze liquid.

14. The cooling system of claim 1, wherein the at least one enclosure includes a plurality of enclosure, and a quantity of the enclosures is equal to a quantity of the geothermal wells.

15. The cooling system of claim 1, wherein the at least one enclosure is a rack configured to house a plurality of electronic servers or computing equipment.

16. The cooling system of claim 1, wherein the at least one cold plate thermal exchanger is formed as a stainless-steel structure.

17. The cooling system of claim 1, wherein an exterior of the cold plate thermal exchanger is powder coated with a white finish.

18. The cooling system of claim 1, wherein the cooling system is configured to continue operating in the event of failure of a pump within one of the plurality of geothermal wells.

19. The cooling system of claim 1, further comprising at least one cold plate thermal exchanger configured to cool fluid within the fluid circuit, wherein fluid cooled via the at least one cold plate thermal exchanger is directed back into the plurality of geothermal wells.

20. A method for cooling electronic equipment, the method comprising:
    pumping geothermally cooled fluid through a fluid circuit from a plurality of geothermal wells, each including an internal pump, each geothermal well of the plurality of geothermal wells connected in parallel with each other geothermal well of the plurality of geothermal wells;
    further cooling fluid within the fluid circuit via at least one cold plate thermal exchanger that is exposed to an ambient environment, wherein fluid within the fluid circuit is selectively exposed to the at least one cold plate thermal exchanger based on a signal from at least one temperature-controlled mixing valve; and
    providing the cooled fluid to a plurality of enclosures housing electronic equipment.

\* \* \* \* \*